United States Patent
El Markhi et al.

(10) Patent No.: US 10,938,403 B2
(45) Date of Patent: Mar. 2, 2021

(54) BATTERY CHARGING AND MEASUREMENT CIRCUIT

(71) Applicant: TEXAS INSTRUMENTS INCORPORATED, Dallas, TX (US)

(72) Inventors: Mustapha El Markhi, Richardson, TX (US); Erhan Ozalevli, Richardson, TX (US); Tuli Dake, Plano, TX (US); Rohit Bhan, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 109 days.

(21) Appl. No.: 16/191,225

(22) Filed: Nov. 14, 2018

(65) Prior Publication Data

US 2020/0007145 A1 Jan. 2, 2020

Related U.S. Application Data

(60) Provisional application No. 62/692,411, filed on Jun. 29, 2018.

(51) Int. Cl.
*H02J 7/00* (2006.01)
*H02J 7/14* (2006.01)
*H03M 1/66* (2006.01)

(52) U.S. Cl.
CPC .............. *H03M 1/66* (2013.01); *H02J 7/007* (2013.01)

(58) Field of Classification Search
USPC ........................................................ 320/163
See application file for complete search history.

(56) References Cited

U.S. PATENT DOCUMENTS

| | | | |
|---|---|---|---|
| 6,577,135 B1 | 6/2003 | Matthews et al. | |
| 9,698,815 B1 * | 7/2017 | Boulemnakher | H03M 1/66 |
| 9,960,780 B1 * | 5/2018 | Venkataraman | H03K 17/162 |
| 10,345,837 B1 * | 7/2019 | Valencia | H03M 1/66 |
| 2002/0109618 A1 * | 8/2002 | Clara | H03M 1/66 |
| | | | 341/136 |
| 2014/0063348 A1 | 3/2014 | Verlinden | |
| 2018/0131377 A1 * | 5/2018 | Ozalevli | H03L 7/099 |
| 2020/0007145 A1 * | 1/2020 | El Markhi | H02J 7/007 |

FOREIGN PATENT DOCUMENTS

| | | |
|---|---|---|
| EP | 1227563 A2 | 7/2002 |
| WO | 2016137768 A1 | 9/2016 |

OTHER PUBLICATIONS

Search Report for PCT Application No. PCT/US19/39821, of the international search report dated Sep. 26, 2019, 1 page.

* cited by examiner

*Primary Examiner* — Alexis B Pacheco
(74) *Attorney, Agent, or Firm* — Mark Allen Valetti; Charles A. Brill; Frank D. Cimino

(57) ABSTRACT

An example device comprises a digital-to-analog converter (DAC) comprising first and second transistors coupled to a first amplifier, the second transistor coupled to a first output of the DAC and to an output of the first amplifier, and third and fourth transistors coupled to the first amplifier and to a second output of the DAC, the third and fourth transistors switchably coupled to a voltage supply and to the first transistor. The device also comprises a first node coupled to the first output of the DAC and to a resistor. The device further includes a second node coupled to the second output of the DAC, and a second amplifier coupled to the second node and to the first transistor and switchably coupled to the third and fourth transistors. The device also comprises a comparator coupled to the first node.

7 Claims, 6 Drawing Sheets

FIG. 4

|  | 400 | 402 | 404 | 406 | 408 | 410 | 412 | 414 |
|---|---|---|---|---|---|---|---|---|
| 416 | 1 | 1 | 1 | 1 | 1 | 1 | 1 | 1 |
| 418 | 0 | 1 | 1 | 1 | 1 | 1 | 1 | 1 |
| 420 | 0 | 0 | 1 | 1 | 1 | 1 | 1 | 1 |
| 422 | 0 | 0 | 0 | 1 | 1 | 1 | 1 | 1 |
| 424 | 0 | 0 | 0 | 0 | 1 | 1 | 1 | 1 |
| 426 | 0 | 0 | 0 | 0 | 0 | 1 | 1 | 1 |
| 428 | 0 | 0 | 0 | 0 | 0 | 0 | 1 | 1 |
| 430 | 0 | 0 | 0 | 0 | 0 | 0 | 0 | 1 | ns
BATTERY CHARGING AND MEASUREMENT CIRCUIT

CROSS-REFERENCE TO RELATED APPLICATIONS

This non-provisional application claims priority to U.S. Provisional App. No. 62/692,411, filed on Jun. 29, 2018 and entitled "High Accuracy Adaptive Termination Battery Charger," which is hereby incorporated herein by reference in its entirety.

SUMMARY

An example device comprises a digital-to-analog converter (DAC) comprising first and second transistors coupled to a first amplifier, the second transistor coupled to a first output of the DAC and to an output of the first amplifier, and third and fourth transistors coupled to the first amplifier and to a second output of the DAC, the third and fourth transistors switchably coupled to a voltage supply and to the first transistor. The device also comprises a first node coupled to the first output of the DAC and to a resistor. The device further includes a second node coupled to the second output of the DAC, and a second amplifier coupled to the second node and to the first transistor and switchably coupled to the third and fourth transistors. The device also comprises a comparator coupled to the first node.

An example device comprises a digital-to-analog converter (DAC), a first node coupled to a first output of the DAC, a second node coupled to a second output of the DAC and configured to couple to a battery, a first amplifier configured to receive a first reference voltage and a voltage at the first node, the first amplifier having a first output coupled to the DAC, a second amplifier configured to receive a second reference voltage and a voltage at the second node, the second amplifier having a second output coupled to the DAC, and a first comparator configured to receive the voltage at the first node and a third reference voltage that is a fraction of the first reference voltage. The DAC is configured to provide a first current on the first output of the DAC based on one of the first and second outputs of the first and second amplifiers, provide a second current on the second output of the DAC based on one of the first and second outputs of the first and second amplifiers, and decrease a ratio of the second current to the first current in response to an output of the comparator indicating that the voltage at the first node is below the third reference voltage.

An example mobile device comprises a first node coupled to a resistor, a second node coupled to a battery, and a digital-to-analog converter (DAC) having a first output configured to provide a first current through the resistor via the first node and a second output configured to provide a second current via the second node to charge the battery. The mobile device also comprises a controller configured to adjust the DAC to decrease a ratio of the second current to the first current in response to a voltage at the first node falling below a threshold voltage.

BRIEF DESCRIPTION OF THE DRAWINGS

For a detailed description of various examples, reference will now be made to the accompanying drawings in which:

FIG. 4 depicts a table showing example register bit configurations usable to control a DAC in a BCM IC.

DETAILED DESCRIPTION

Various mobile electronic devices, such as smartphones, are powered using batteries. Charging a battery is a difficult and possibly dangerous task, as overcharging can result in excessive temperatures, fires, or explosions, and undercharging can compromise long-term battery performance. Battery charging should thus terminate at a specific time and with a specific current that gradually tapers to a low level (which is called a termination current). To achieve battery charging that terminates at the proper time and at the proper current, the current should be accurately and precisely monitored, even at low levels that are difficult to detect. Circuits presently used to measure such termination currents are suboptimal at least because they cannot properly distinguish the low-level termination current from noise. For example, measurements of such termination currents are negatively impacted by noise produced by the measurement circuit, particularly when the noise is stronger than the termination current itself.

Described herein is a battery charging and measurement circuit. The circuit produces a charge current that is used to charge batteries. The circuit also produces a proxy current (equivalently called a sense current) that is a fraction of the amplitude of the charge current. The amplitude curves of the charge and proxy currents are thus similar. As the battery nears completion of charging, the charge current becomes small. Because the proxy current is a fraction of the charge current, when the charge current becomes small, the proxy current also becomes small, often too small to accurately and precisely measure. Accordingly, in response to a voltage corresponding to the proxy current dropping below a threshold level, the circuit boosts the amplitude of the current (and, thus, the voltage) to a range that is readily measurable with accuracy and precision despite circuit noise. The circuit boosts the amplitude by shifting a bit register, the bits of which are used to control the proxy and charge currents, as is explained in greater detail below. Each time the voltage drops below the threshold level, the circuit again boosts the amplitude of the proxy current (and, thus, the voltage) so that the voltage is again readily measurable despite circuit noise. This iterative process continues a finite number of times, e.g., until it is likely safe to terminate charging. In this manner, the proxy current is readily, accurately, and precisely measurable (even when charging is nearly complete), and the above-described problems are mitigated.

Figure 1:
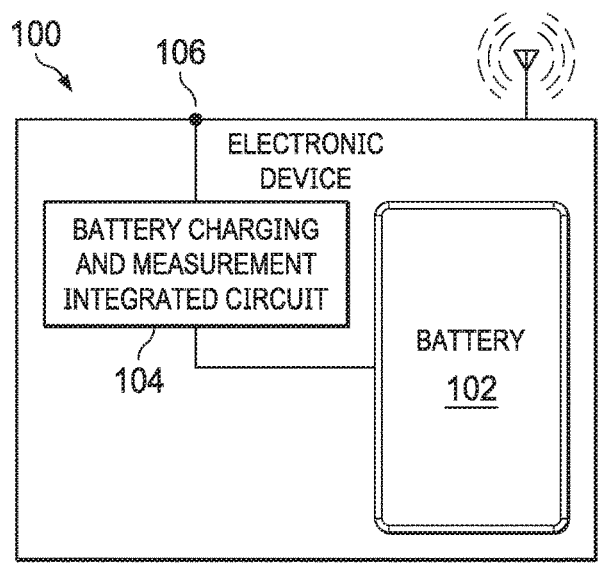
FIG. 1 depicts a block diagram of an example battery-powered electronic device comprising a battery and an example battery charging and measurement integrated circuit (BCM IC).

FIG. 1 depicts a block diagram of an example battery-powered electronic device 100, such as a mobile device (e.g., a smartphone). The electronic device 100 comprises a battery 102 and a battery charging and measurement integrated circuit (BCM IC) 104 coupled to the battery 102. The battery 102 is any suitable type of battery that is capable of providing power to the electronic device 100 to enable the electronic device 100 to perform its intended functions. In an example, the BCM IC 104 is a single chip housed inside a package. In an example, the BCM circuitry is distributed across multiple chips, with all such chips housed inside a single package. Other variations on the precise configuration of the BCM circuit are contemplated and included within the scope of this disclosure. The BCM IC 104 couples to a port 106 to which a power supply can couple. For example, a user is able to connect the port 106 to mains power via an adapter. FIG. 1 is merely an example device in which the BCM IC 104 can be implemented. Other applications, which include various other devices that use rechargeable batteries, will also find benefit with the BCM IC 104.

In operation, the BCM IC 104 receives power via the port 106 and uses the power to charge the battery 102. Specifically, the BCM IC 104 implements the techniques alluded to above and described in greater detail below to achieve greater accuracy and precision in proxy current measurements when charging the battery 102. As explained, these techniques are especially helpful when charging of the battery 102 is nearly complete and the charging current has been reduced to a relatively small termination current that is difficult to accurately and precisely measure.

Figure 2A:
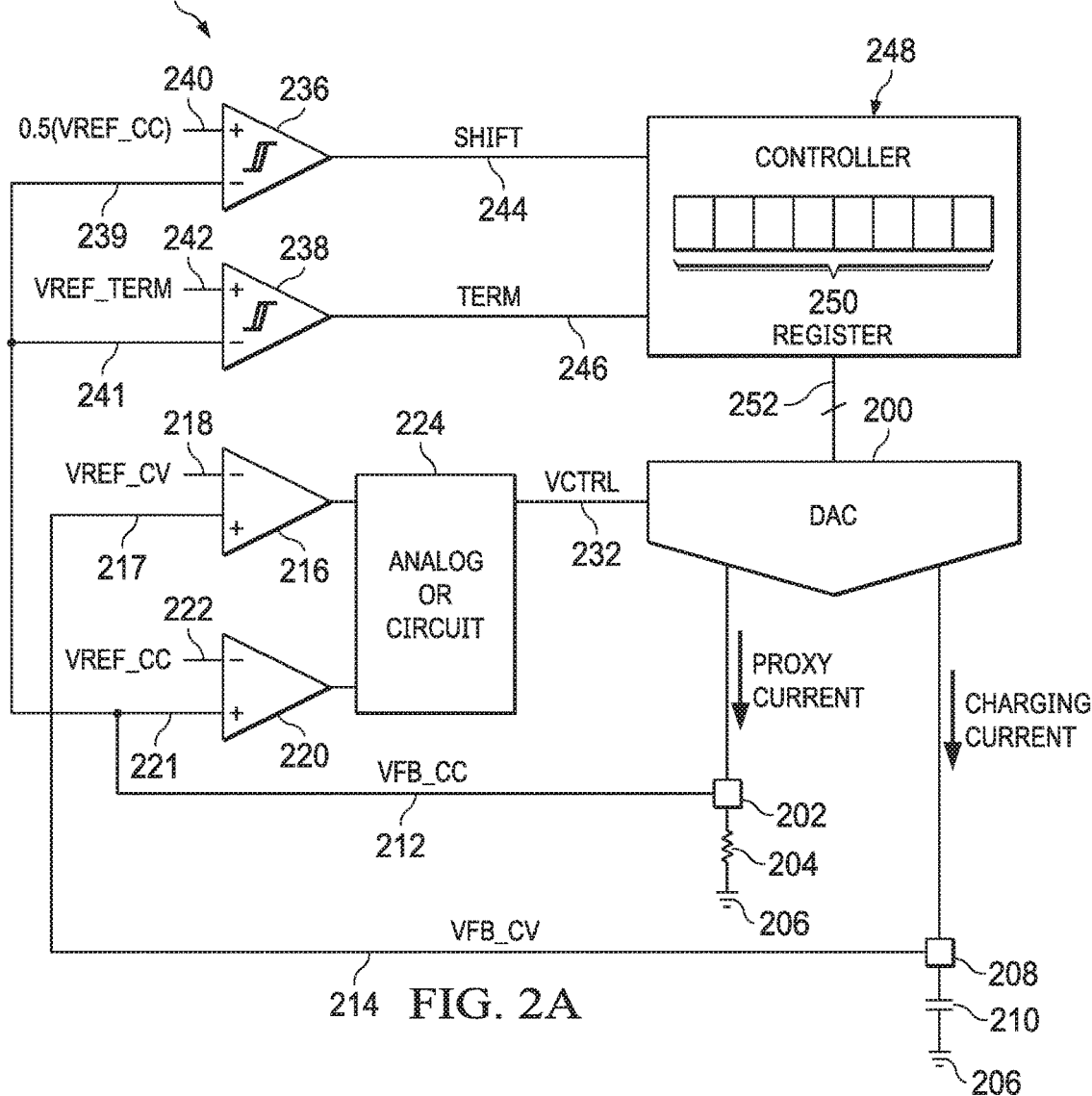
FIG. 2A depicts a circuit schematic diagram of an example BCM IC.

FIG. 2A depicts a circuit schematic diagram of an example BCM IC 104. The BCM IC 104 includes a digital-to-analog converter (DAC) 200. The DAC 200 has a first output that couples to a node 202 and a second output that couples to a node 208. The node 202 couples to a resistor 204 which, in turn, couples to ground 206. The resistance of the resistor 204 can be selected as desired to realize the functions described herein. The node 208 couples to a battery 210, represented in FIG. 2A as a capacitor. The battery 210, in turn, couples to ground 206. The node 202 also couples to an amplifier 220 (e.g., a differential amplifier), a comparator 236, and a comparator 238. The node 208 couples to an amplifier 216 (e.g., a differential amplifier).

The amplifier 220 comprises two inputs: an input 221, which receives a voltage VFB_CC from node 202 via connection 212, and an input 222, which receives a reference voltage VREF_CC from any suitable source of reference signals (e.g., other circuitry on the IC). The amplifier 216 comprises two inputs: an input 217, which receives a voltage VFB_CV from node 208 via connection 214, and an input 218, which receives a reference voltage VREF_CV from any suitable source of reference signals. The comparator 238 comprises two inputs: an input 241, which receives the voltage VFB_CC from node 202 via connection 212, and an input 242, which receives a reference voltage VREF_TERM from any suitable source of reference signals. The comparator 236 comprises two inputs: an input 239, which receives VFB_CC from node 202 via connection 212, and an input 240, which receives a reference voltage that is a fraction of VREF_CC (e.g., one-half of VREF_CC, or 0.5(VREF_CC)). The fraction may be set as desired, with practical considerations in selecting fraction values described in greater detail below.

Figure 2B:
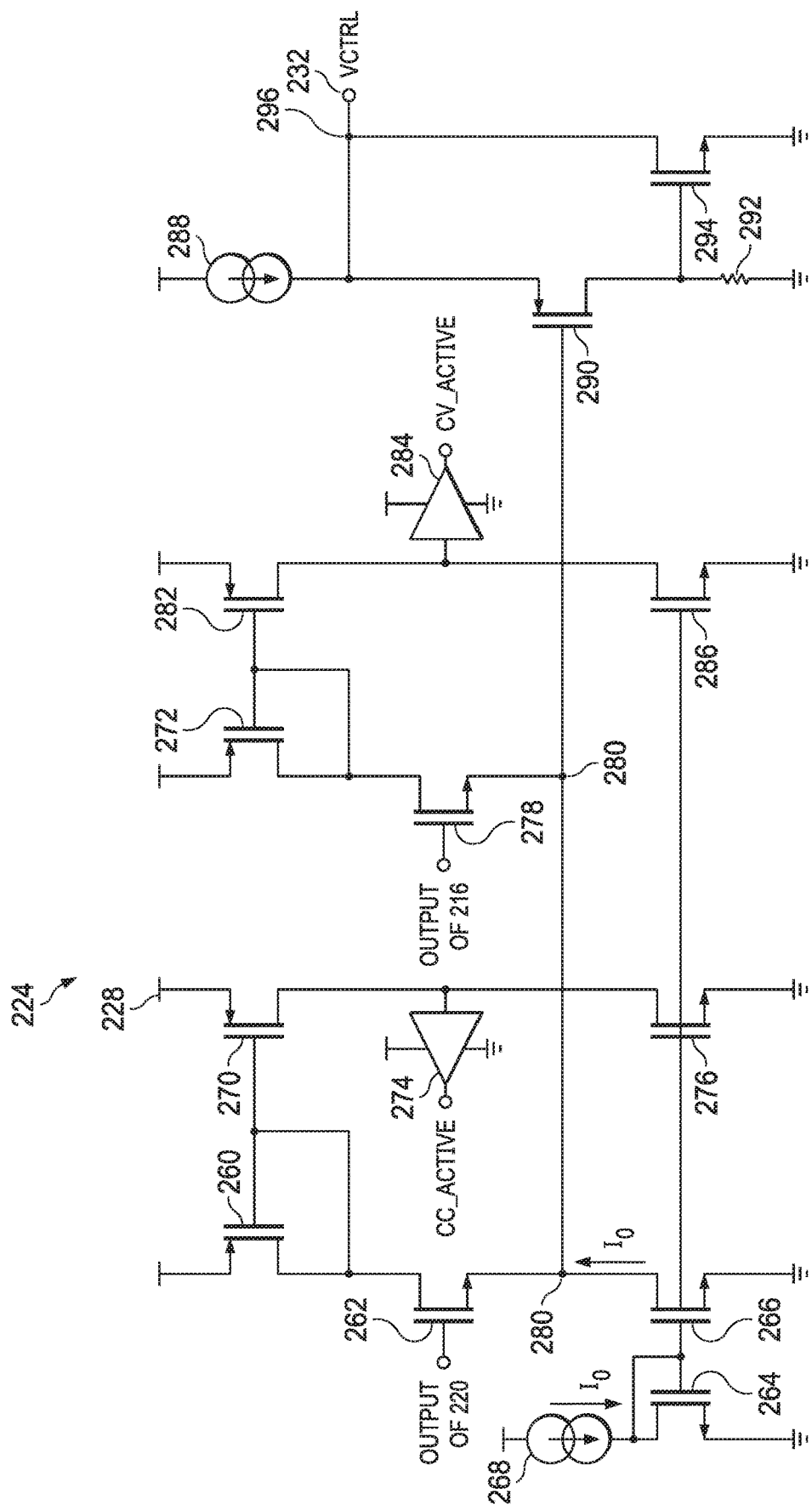
FIG. 2B depicts an example analog OR circuit.

The BCM IC 104 additionally includes an analog OR circuit 224 to implement a logic OR functionality. The analog OR circuit 224 receives the outputs of the amplifiers 216, 220 as inputs and provides signal VCTRL as an output on connection 232. An example analog OR circuit 224 is depicted in FIG. 2B. The analog OR circuit 224 comprises p-type MOSFETs 260, 270, 272, and 282 having their sources coupled to voltage source 228. A drain of the p-type MOSFET 260 couples to the gate of the p-type MOSFET 260 and to a drain of n-type MOSFET 262. A gate of the n-type MOSFET 262 couples to the output of amplifier 220. The source of the n-type MOSFET 262 couples to node 280, which, in turn, couples to a drain of n-type MOSFET 266. The source of n-type MOSFET 266 couples to ground. A gate of the n-type MOSFET 266 couples to a gate of n-type MOSFET 264. The source of n-type MOSFET 264 couples to ground. The drain of n-type MOSFET 264 couples to a current source 268, which couples to voltage source 228. The drain of the n-type MOSFET 264 couples to the gates of n-type MOSFETs 264 and 266.

The gates of the p-type MOSFETs 260, 270 are tied together. A drain of the p-type MOSFET 270 couples to the drain of n-type MOSFET 276. The source of n-type MOSFET 276 couples to ground and a gate of the n-type MOSFET 276 couples to the gate of the n-type MOSFET 266. The drain of the n-type MOSFET 276 couples to a digital buffer 274, which produces an output CC_ACTIVE.

The node 280 couples to a source of n-type MOSFET 278, the gate of which couples to the output of amplifier 216. The drain of the n-type MOSFET 278 couples to the drain of p-type MOSFET 272. The gate of p-type MOSFET 272 couples to the gate of p-type MOSFET 282. The drain of p-type MOSFET 282 couples to the drain of n-type MOSFET 286, the gate of which couples to the gate of n-type MOSFET 276 and the source of which couples to ground. The drain of p-type MOSFET 282 couples to digital buffer 284, the output of which is CV_ACTIVE.

The node 280 couples to the gate of p-type MOSFET 290. A drain of p-type MOSFET 290 couples to resistor 292, which couples to ground. The drain of p-type MOSFET 290 also couples to the gate of n-type MOSFET 294, the source of which couples to ground. The source of p-type MOSFET 290 and the drain of n-type MOSFET 294 couple together at node 296, which couples to connection 232 and provides output signal VCTRL to connection 232. The node 296 couples to current source 288, which couples to the voltage source 228.

Referring again to FIG. 2A, the BCM IC 104 comprises a controller 248, such as a processor. The controller 248 stores a multi-bit (e.g., m-bit) register 250. In an example, the register 250 is an 8-bit register, although any number of bits is usable. Practical considerations of selecting various register sizes are described in greater detail below. The controller 248 controls the contents of the register 250, for example by shifting bits to the left or to the right or by overwriting bits. The output of the comparator 236 couples to the controller 248 via a connection 244 that provides a SHIFT signal to the controller 248. The output of the comparator 238 couples to the controller 248 via a connection 246 that provides a termination (TERM) signal to the controller 248. Other configurations of and various modifications to the BCM IC 104 are contemplated and included within the scope of this disclosure. The controller 248 couples to the DAC 200 via connections 252.

The operation of the BCM IC 104 is described by first referring only to the components other than the controller 248 and the comparators 236 and 238, and then explaining the function of the controller 248 and the comparators 236 and 238. The DAC 200 outputs a current to the node 202 and outputs another current to the node 208. The current output to the node 208 is termed a charging current, since that current is provided to the battery 210 for charging. The current output to the node 202 is termed a proxy current, since the proxy current is a smaller fraction of the charging current. (The ratio between the proxy and charging currents is set using a network of appropriately-sized transistors housed within the DAC 200, as will be described further below.)

The charging current charges the battery 210. As the battery 210 charges, the voltage at node 208 rises. The voltage at node 208 is thus usable to monitor the charging status of the battery 210. However, it is not usable to monitor the amplitude of the charging current itself. The proxy current, which is a smaller fraction of the charging current, is helpful in this regard. By passing the proxy current through the resistor 204 and monitoring the voltage at node 202, the proxy current amplitude can be monitored. Thus, in effect, the voltage at node 202 serves as a proxy for the amplitude of the proxy current, and the amplitude of the proxy current serves as a proxy for the amplitude of the charging current. Accordingly, by monitoring the voltage at node 202, the amplitude of the charging current is likewise monitored.

The amplifier 216 produces an output based on the difference between the voltage at node 208 and VREF_CV. The amplifier 220 produces an output based on the difference between the voltage at node 202 and VREF_CC. Referring to FIG. 2B, the output of amplifier 216 couples to the gate of n-type MOSFET 278, and the output of amplifier 220 couples to the gate of n-type MOSFET 262. The n-type MOSFETs 262, 266 form an NMOS source follower. The n-type MOSFETs 278, 266 form another NMOS source follower. The MOSFETs 290, 294 form a super source follower. The analog OR function is primarily implemented by the n-type MOSFETs 262, 278. The output of amplifier 220 turns on the n-type MOSFET 262 fully or weakly, depending on the signal applied to the gate terminal of the n-type MOSFET 262. Similarly, the output of amplifier 216 turns on the n-type MOSFET 278 fully or weakly, depending on the signal applied to the gate terminal of the n-type MOSFET 278. The source of n-type MOSFET 262 follows the gate of n-type MOSFET 262, and the same is true for the source and gate of n-type MOSFET 278. Whichever of the two MOSFETs 262, 278 is more strongly turned on will pass most (e.g., 90% or more) of the current IO generated by the current source 268 and mirrored by the MOSFETs 264, 266 to node 280. The sources of the MOSFETs 262, 278 couple at node 280, meaning that whichever of the two MOSFETs is most strongly turned on and has a current contribution to node 280 that dominates the node 280 will be the main driver of the gate of p-type MOSFET 290. The source of the p-type MOSFET 290 follows the gate of the p-type MOSFET 290. Thus, the gate signal drives VCTRL on node 296 at connection 232. (As explained in detail below, VCTRL controls the proxy and charging currents by controlling the drain-source channels of the transistors in the DAC 200.)

The n-type MOSFET 294 acts as a super source follower that lowers the impedance on node 296 and adds stability to VCTRL. The n-type MOSFET 294 pulls down the node 296 (VCTRL) as a result of current flowing through the resistor 292 (and thus turning on the n-type MOSFET 294) when p-type MOSFET 290 is turned on. The p-type MOSFET 290, in turn, is turned on when node 280 goes low.

The MOSFETs 260, 270, and 276 and the digital buffer 274 form a current comparator that detects when the amplifier 220 dominates VCTRL, and the MOSFETs 272, 282, and 286 and the digital buffer 284 form another current comparator that detects when the amplifier 216 dominates VCTRL. The digital buffer 274 produces an output CC_ACTIVE that indicates whether or not the amplifier 220 dominates VCTRL, and the digital buffer 284 produces an output CV_ACTIVE that indicates whether or not the amplifier 216 dominates VCTRL. When CC_ACTIVE is high, CV_ACTIVE is low, and vice versa. Specifically, in the case where the amplifier 220 is strongly turns on the n-type MOSFET 262, the majority (e.g., 90%) of the current IO flows through MOSFETs 262, 260, and 270, while a substantially smaller current flows through the n-type MOSFET 276. The greater current through p-type MOSFET 270 relative to the current through n-type MOSFET 276 pulls up the input to the digital buffer 274, causing CC_ACTIVE to be high. Conversely, when the amplifier 220 is not strongly turned on, the current flowing through MOSFETs 262, 260, and 270 is significantly lower (e.g., 10% of the IO current). In this situation, the current through n-type MOSFET 276 is greater than current through p-type MOSFET 270, thus pulling the input to the digital buffer 274 down and causing CC_ACTIVE to be low. A similar principle applies to the operation of the current comparator formed by MOSFETs 272, 282, 286, and the digital buffer 284.

The CC_ACTIVE and/or CV_ACTIVE signals are provided to and usable by the controller 248 to, e.g., perform the steps of the method 600, which is described below. In the relatively early stages of charging the battery 210, the voltage at node 208 is far below VREF_CV. As a result, the output of the amplifier 216 is small, and the amplifier 216 thus does not control VCTRL. The amplifier 220, however, does control VCTRL, because the amplifier 220 operates in a feedback loop whereby the amplifier 220 adjusts its output (VCTRL) in an attempt to equalize its two inputs. Thus, the voltage at node 202 is substantially equivalent to VREF_CC. (The amplifier 216 also attempts to equalize its inputs, but to do so, the battery 210 is to be charged to a point that the voltage at node 208 is equivalent to VREF_CV, which is a time-consuming process. The voltage at node 202 adapts more quickly because it connects to a resistor 204 instead of a battery.)

For the reasons just described, in the early stages of the charging process, the voltage at node 202 is roughly equivalent to the value selected for VREF_CC, and thus the proxy current is set by the value selected for VREF_CC. The charging current is a function of the proxy current according to a ratio set by the network of transistors within the DAC 200 (described below). In an example, the charging current is 2× the proxy current. In an example, the charging current is 4× the proxy current. Other ratios are contemplated and included in the scope of this disclosure.

In these early stages of the charging process, therefore, the battery 210 continues to charge at a rate that is determined by the charging current amplitude, which, in turn, is determined by the proxy current, which, in turn, is determined by the voltage at node 202, which, in turn, is determined by value selected for VREF_CC. However, there comes a point in time when the battery 210 is sufficiently charged that the voltage at node 208 is close enough to VREF_CV that the output of the amplifier 216 dominates the output of the amplifier 220 and takes control of VCTRL, as described above with respect to FIG. 2B. The VCTRL signal continues to decrease as the battery 210 approaches a fully charged status, which causes the charging current to decrease as well. As the amplifier 220 no longer controls the proxy current, the proxy current is now a function of the charging current. As explained above, in examples, the proxy current is a smaller fraction of the charging current according to a ratio set by the transistor network within the DAC 200 (described in detail below).

As the charging current continues to decrease due to the battery 210 continuing to charge, the proxy current likewise decreases. Although the amplifier 220 has minimal or no effect on VCTRL, the voltage at node 202 is still used by the comparator 238 to determine when the charging process should be terminated. If the voltage at the node 202 is so small that it is difficult to accurately interpret (e.g., due to being masked by noise), the comparison performed by the comparator 238 between the voltage at node 202 and VREF_TERM can be flawed. In such instances, the TERM signal can be asserted (or, in some examples, de-asserted) at inappropriate times.

Accordingly, it is beneficial to repeatedly increase the voltage at node 202 when the voltage at node 202 drops below a threshold, thereby providing an easy-to-read voltage at node 202. This is at least part of the function of the comparator 236, the controller 248, the register 250, and the DAC 200, as is now described with respect to FIG. 3.

Figure 3:
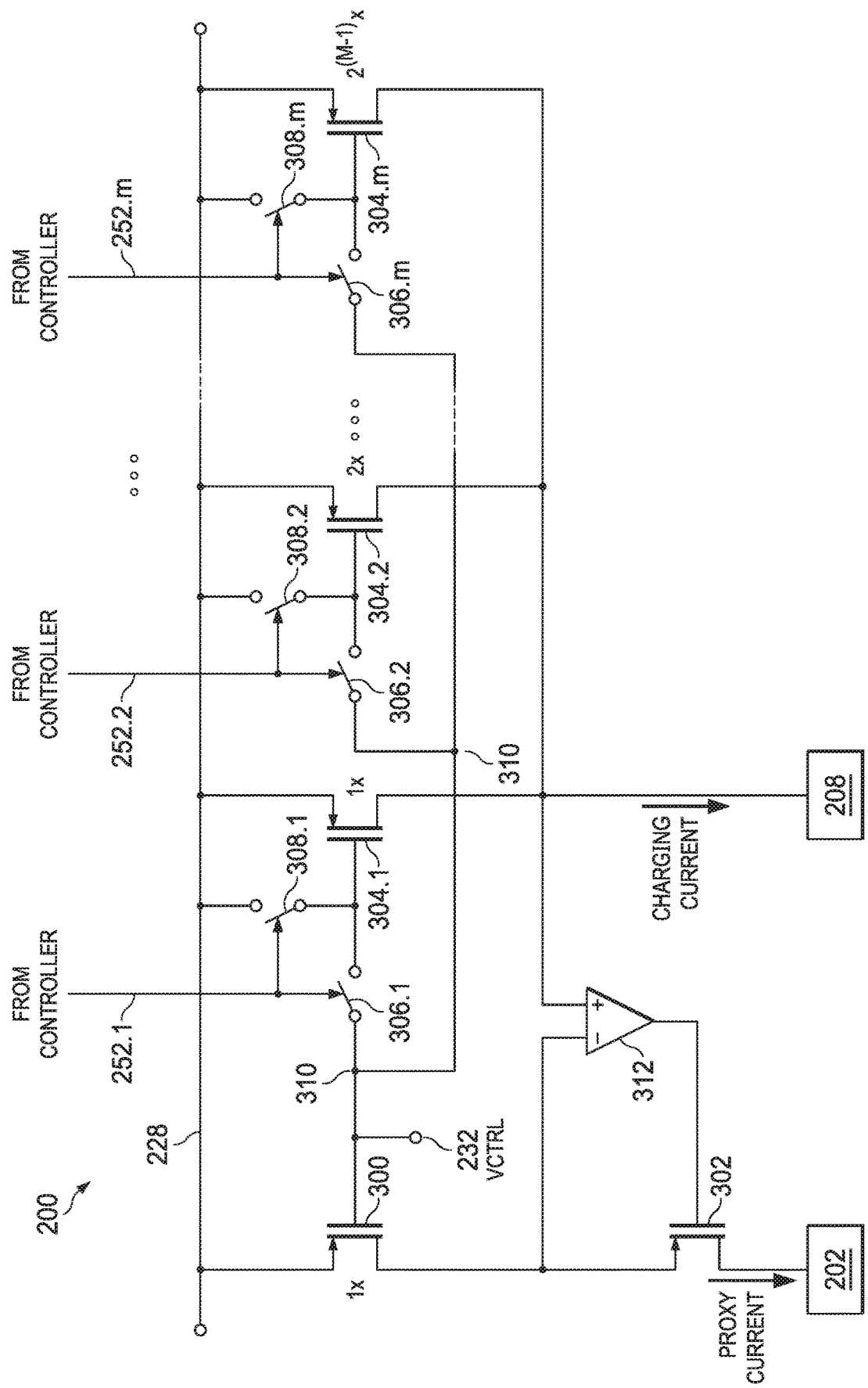
FIG. 3 depicts a circuit schematic diagram of an example digital-to-analog converter (DAC) in a BCM IC.

FIG. 3 depicts a circuit schematic diagram of an example DAC 200 in a BCM IC 104. As mentioned above, the DAC 200 includes a network of transistors, which are now described and which, in at least some examples, are metal oxide semiconductor field effect transistors (MOSFETs), such as p-type MOSFETs. The network of transistors in the DAC 200 includes a transistor 300 having a source terminal coupled to a voltage supply 228 and a drain terminal coupled to the source terminal of a transistor 302. The drain terminal of the transistor 302 couples to the node 202. (The node 202 is not part of the DAC 200.) The drain terminal of the transistor 300 and the source terminal of the transistor 302 couple to an inverting input of an amplifier 312 (e.g., differential amplifier). The output of the amplifier 312 couples to a gate terminal of the transistor 302 and adjusts the drain-source channel of the transistor 302 in an attempt to equalize the voltages at the drains of the transistors 300 and the transistors 304.1, 304.2, . . . , 304.*m*. The gate terminal of the transistor 300 couples to the connection 232 (VCTRL) at a node 310.

The network of transistors in the DAC 200 further comprises a set of transistors that couple to the node 208. (The node 208 is not part of the DAC 200.) In an example, the set of transistors includes transistors 304.1, 304.2, . . . , 304.*m*, where m corresponds to the number of bits in the register 250. In an example, the transistors 304.1, 304.2, . . . , 304.*m* are sized in an ascending manner relative to the transistor 300. For example, assuming transistor 300 has a size of 1×, the transistor 304.1 has a size of 1×, the transistor 304.2 has a size of 2×, and the transistor 304.*m* has a size of $2^{(m-1)}$×. Thus, in this example, the transistor 304.*m* is substantially larger in size than the transistor 304.1, and the transistor 304.1 is the same size as the transistor 300. Other sizing configurations are contemplated.

The source terminals of the transistors 304.1, 304.2, . . . , 304.*m* couple to the voltage supply 228. The drain terminals of these transistors couple to each other, to the non-inverting input to the amplifier 312, and to the node 208. Each of the gate terminals of these transistors 304.1, 304.2, . . . , 304.*m* is switchably coupled to the voltage supply 228 and is switchably coupled to the gate terminal of the transistor 300 at node 310. For example, the gate terminal of the transistor 304.1 is switchably coupled to the voltage supply 228 via switch 308.1 and is switchably coupled to the node 310 via switch 306.1. In an example, the switches 308.1 and 306.1 are MOSFETs. In an example, the switches 308.1 and 306.1 are p-type and complementary (CMOS) MOSFETs, respectively, and are controlled by a signal on a connection 252.1 from the controller 248.

The gate terminal of the transistor 304.2 is switchably coupled to the voltage supply 228 via a switch 308.2 (e.g., a p-type MOSFET) and to the node 310 via a switch 306.2 (e.g., a CMOS). The switches 308.2 and 306.2 are controlled by a signal on a connection 252.2 from the controller 248.

The gate terminal of the transistor 304.*m* is switchably coupled to the voltage supply 228 via a switch 308.*m* (e.g., a p-type MOSFET) and to the node 310 via a switch 306.*m* (e.g., a CMOS). The switches 308.*m* and 306.*m* are controlled by a signal on a connection 252.*m* from the controller 248.

The signals on connections 252.1, 252.2, . . . , 252.*m* from the controller 248 are based on bits in the register 250. In an example, the signal on connection 252.1 depends on the value of the least significant bit in the register 250, the signal on connection 252.2 depends on the value of the second-least significant bit in the register 250, and the signal on connection 252.*m* depends on the most significant bit in the register 250. For example, the controller 248 provides a high signal on connection 252.1 in response to the least significant bit in the register 250 being a 1, and a low signal on connection 252.1 in response to the least significant bit in the register 250 being a 0. Similarly, the controller 248 provides a high signal on connection 252.2 in response to the second-least significant bit in the register 250 being a 1, and a low signal on connection 252.2 in response to the second-least significant bit in the register 250 being a 0. Likewise, the controller 248 provides a high signal on connection 252.*m* in response to the most significant bit in the register 250 being a 1, and a low signal on connection 252.*m* in response to the most significant bit in the register 250 being a 0. These conventions can be modified as desired.

The operation of the DAC 200 is now described in tandem with FIGS. 2 and 3. As explained above, it is possible that the voltage at node 202 becomes so low (particularly when charging is almost complete) that it is difficult to accurately interpret the voltage and thus properly terminate charging of the battery 210. In such instances, as also explained above, it is beneficial to repeatedly boost the amplitude of the voltage at node 202 in response to that voltage dropping below a threshold. Boosting the voltage in this manner facilitates accurate and precise interpretation of the voltage at node 202. The manner in which this voltage is increased is now described.

When the voltage at node 202 drops below the reference voltage (e.g., 0.5*VREF_CC) at input 240, the SHIFT signal is asserted. In response to assertion (or, in examples, de-assertion) of SHIFT, the controller 248 shifts the bits in the register 250 to the right by one bit. Thus, for example, the bit that was previously in the least significant bit location is no longer in the register 250, while the bit that was previously in the most significant bit location is now in the second-to-most significant bit location, and the most significant bit location is populated with a 0 bit. (Each shift to the right in this manner is equivalent to dividing the digital bit value by two.) In this manner, the transistor 304.*m*, which has a size $2^{(m-1)}$× relative to the size 1× of the transistor 300, is turned off, since the most significant bit of the register 250 is now populated with a 0. Each time the bits in the register 250 are adjusted due to the voltage at node 202 dropping below the threshold at input 240, more transistors 304.1, 304.2, . . . , 304.*m* turn off. Each time one or more transistors 304.1, 304.2, . . . , 304.*m* turns off, the ratio of the charging current to the proxy current decreases, since there are fewer transistors 304.1, 304.2, . . . , 304.*m* contributing current to the charging current provided to node 208. This process is iteratively repeated until only the transistor 304.1 remains on, while the rest of the transistors 304.2, . . . , 304.*m* are off. In an example, transistor 304.1 has a 1:1 sizing ratio relative to the transistor 300, and so the proxy and charging currents are the same. At this point in time, the charging current and proxy current are both very small, the battery 210 is nearly fully charged, and the charging process is suitable for termination.

FIG. 4 depicts a table showing example register bit configurations usable to control the DAC 200. Specifically, FIG. 4 depicts example register values 416, 418, 420, 422, 424, 426, 428, and 430, each of which is illustrative of the state of the register 250 as the bits of the register 250 are shifted to the right each time the voltage at node 202 drops below the reference voltage at input 240 (FIG. 2A). The numerals 400, 402, 404, 406, 408, 410, 412, and 414 are arranged in order of decreasing bit position significance, with numeral 400 indicating the most significant bit and numeral 414 indicating the least significant bit. Although eight bits are shown in the registers, any number of bits can be selected.

Register value 416 begins with an illustrative bit configuration of 11111111. When this configuration is present in the register 250, each of the transistors 304.1, 304.2, . . . , 304.$m$ is on. For example, because the most significant bit (numeral 400) for register 416 contains a 1, the connection 252.$m$ carries a high signal, which closes switch 306.$m$ and opens switch 308.$m$. Accordingly, VCTRL is provided to the gate terminal of transistor 304.$m$, and VCTRL is less than the voltage supply 228 at the source terminal of the transistor 304.$m$. Because the transistor 304.$m$ is a PMOS and the source terminal is sufficiently lower in voltage than the gate terminal, the transistor 304.$m$ turns on. The same is true for the remaining transistors 304.1, . . . , 304.$m$−1. Because all of these transistors are on, the charging current is much larger than the proxy current.

Although the charging current is significantly larger than the proxy current, the charging current will decrease over time when the amplifier 216 controls VCTRL (FIG. 2A), since the battery 210 is approaching full charge. Accordingly, when the charging current decreases, the proxy current decreases, which eventually causes the voltage at node 202 to drop below the reference voltage at input 240. When this occurs, SHIFT is asserted, which causes the controller 248 to shift the bits in the register 250 one bit to the right. This shift causes the register 250 to contain bits similar to those shown in register value 418, with the most significant bit replaced with a 0. This causes all transistors 304.1, 304.2, . . . , 304.$m$−1 to remain on, but transistor 304.$m$ turns off. Because transistor 304.$m$ turns off, the sizing ratio of the remaining transistors 304.1, 304.2, . . . , 304.$m$ to the transistor 300 decreases. This results in a greater proxy current relative to the charging current, and thus the voltage at node 202 is boosted above the reference voltage at input 240.

Over time, the voltage at node 202 will again fall below the reference voltage at input 240 for the reasons described above. Thus, the SHIFT signal will again be asserted, and the controller 248 will again shift the bits in the register 250 so that the register 250 appears as register value 420. The bit string 00111111 causes the transistors 304.$m$−1 and 304.$m$ to both turn off, thus again boosting the proxy current and the voltage at node 202. This process iteratively repeats until the register 250 appears as register value 430, with only the transistor 304.1 remaining on. In this situation, the ratio between transistors 304.1 and 300 is 1:1, meaning that the proxy and charging currents are approximately equal. No further boosting of the voltage at node 202 will occur, but the number of transistors 304.1, 304.2, . . . , 304.$m$, the number of bits in the register 250, and the fraction by which VREF_CC is multiplied to produce the reference voltage at input 240 are all selected so that termination of charging would be appropriate when the ratio reaches 1:1 and no further boosting would be necessary.

When the fraction that is multiplied with VREF_CC to produce the reference voltage at input 240 is relatively high, the comparator 236 will trip more frequently. As a result, the controller 248 will shift the bits in the register 250 more often. It is possible that the bits of the register 250 could be completely shifted out of the register 250 before charging of the battery 210 is complete (or nearly complete), which should be avoided. This problem may be mitigated by selecting a register 250 of a large size (large number of bits), which will maintain frequent boosts for the voltage at node 202 without exhausting the register 250 prematurely. The tradeoff for this approach, however, is the increased circuitry requirements for the DAC 200, since each bit in the register 250 corresponds to a separate transistor and attendant switching circuitry in the DAC 200. When the fraction is relatively low, the comparator 236 will trip less frequently, and the problems above will be avoided. However, the voltage at node 202 may become too low and may cause the inadvertent tripping of the comparator 238, which is also to be avoided. Accordingly, a moderate value of approximately one-half (0.5) may be selected as the fraction with which VREF_CC is multiplied to produce the reference voltage at input 240.

Figure 5:
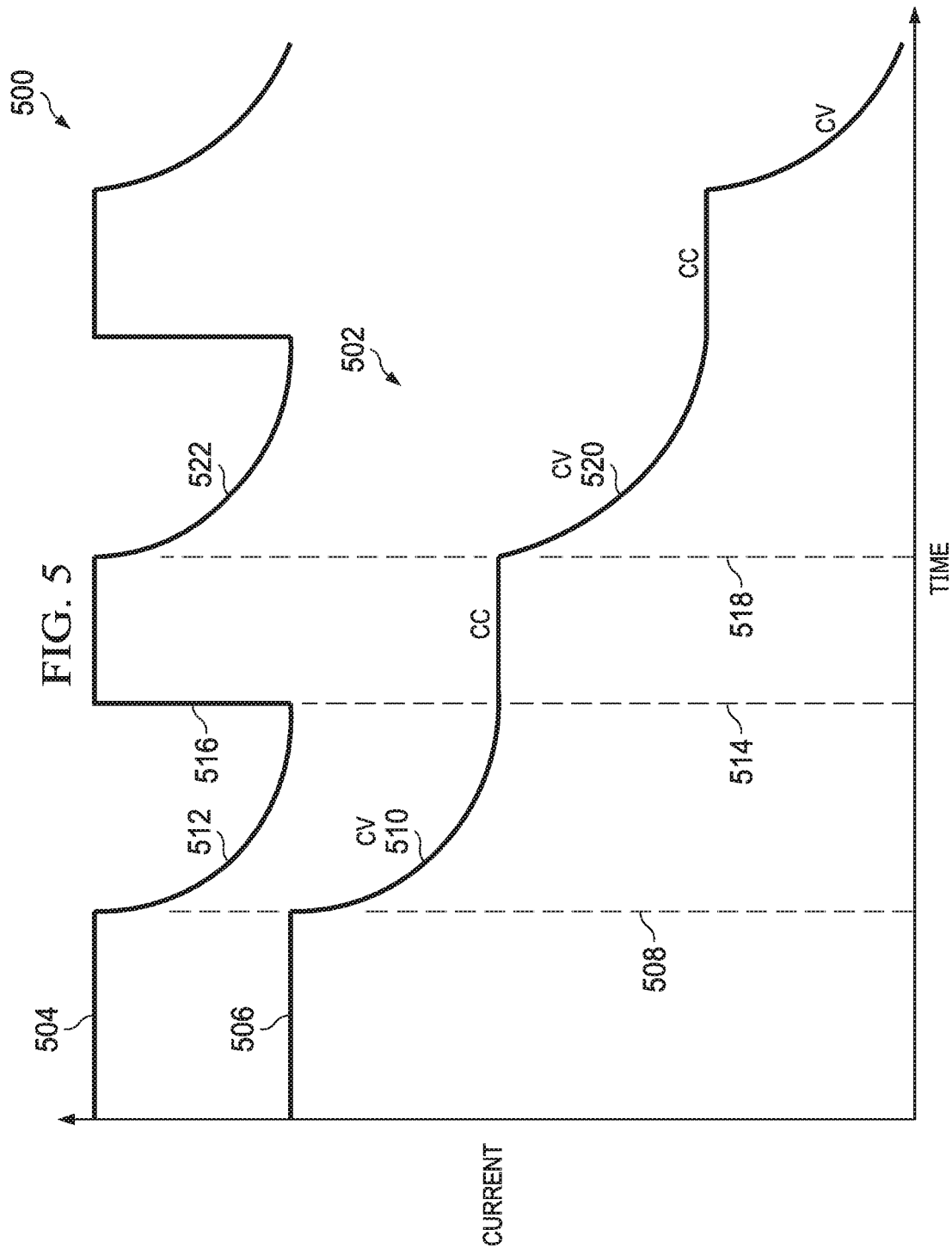
FIG. 5 depicts waveforms describing the behaviors of currents in an example BCM IC.

FIG. 5 depicts current waveforms 500 and 502, which correspond to the proxy current and charging current, respectively. The waveforms 500 and 502 describe the behaviors of these currents as a function of time. The proxy current and charging current begin at constant current levels, as numerals 504 and 506 depict. During this period of time, the amplifier 220 is in control of VCTRL. At the time indicated by numeral 508, the amplifier 216 gains control of VCTRL due to the rising battery voltage. As a result, the charging current decreases, as numeral 510 indicates. (The CV label indicates that the amplifier 216 is in control of VCTRL during this time period.) Because the charging current decreases as numeral 510 indicates, the proxy current follows it and also decreases, as numeral 512 indicates. Eventually, the proxy current reaches a level at time 514 at which the voltage at node 202 falls below the reference voltage at input 240. As a result, the SHIFT signal is asserted, causing the bits in the register 250 to shift to the right one place. This causes one of the transistors 308 to turn off, thereby decreasing the ratio of the charge current to the proxy current and thus boosting the proxy current, at numeral 516 indicates. Consequently, the amplifier 220 regains control of VCTRL, as the label CC indicates, and the currents remain constant until the amplifier 216 again regains control of VCTRL at time 518 due to the charge of the battery 210 relative to the reference voltage at input 218. The process then repeats with both currents again falling in amplitude, as numerals 520, 522 indicate. As this iterative process continues, the charging current continues to diminish in amplitude until the transistor sizing ratio between whichever ones of the transistors 304.1, 304.2, . . . , 304.$m$ that are still on and the transistor 300 is approximately 1:1. At that point, the charging process terminates, with the benefit of a small and precisely-controlled termination charging current. Because no further boosting occurs, the proxy current decreases until the comparator 238 asserts the TERM signal. In response to assertion (or, in examples, de-assertion) of TERM, the controller 248 disconnects the voltage supply from the remainder of the BCM IC 104 (e.g., the DAC 200), for example using a switch. In an alternative example, the TERM signal is provided directly to a switch instead of to the controller 248, in which case the asserted TERM signal causes switch to open. Opening the switch disconnects the voltage supply to the DAC 200.

Figure 6:
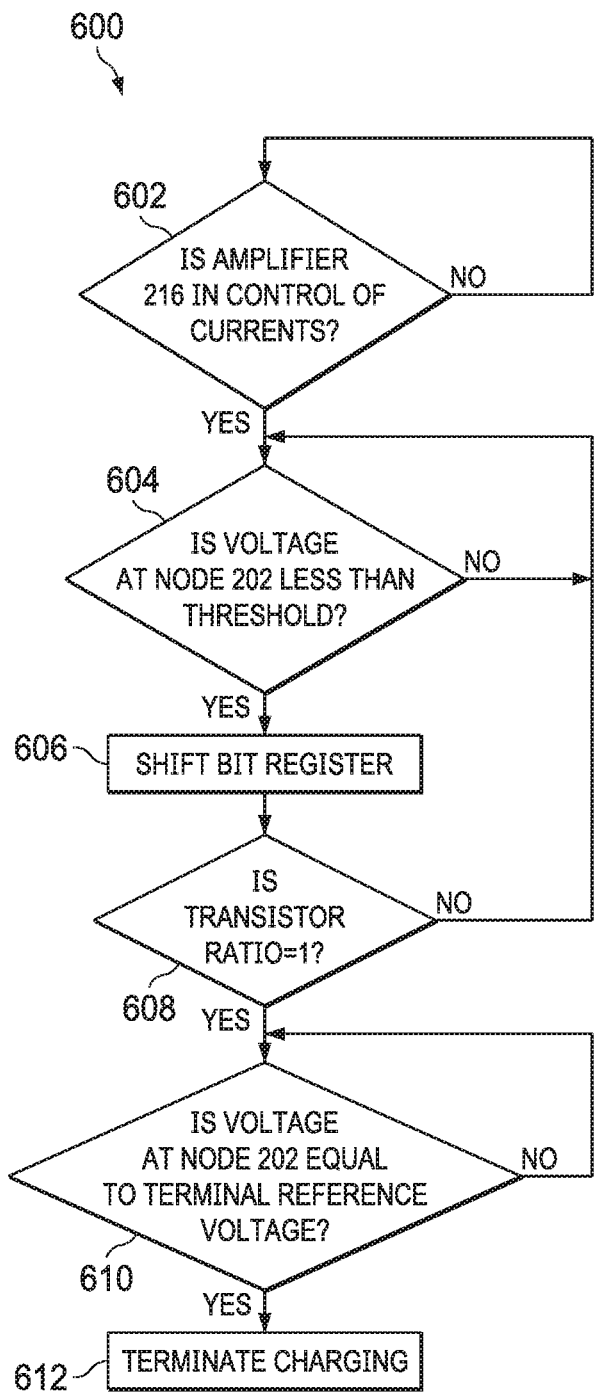
FIG. 6 depicts a flow diagram of an example method of operation for a BCM IC.

FIG. 6 depicts a flow diagram of an example method 600 of operation for a BCM IC 104. One or more of these steps may be performed by the controller 248. The method 600 begins with determining whether the amplifier 216 is in control of the proxy and charging currents (e.g., whether the amplifier 216 is in control of VCTRL) (602). This may be determined using the CC_ACTIVE and/or CV_ACTIVE signals described above with respect to FIG. 2B. If not, 602 is repeated. Otherwise, the method 600 continues by determining whether the voltage at node 202 is less than the threshold voltage at input 240 (604). If not, 604 is repeated. Otherwise, the method 600 comprises shifting the bit register (606). The method 600 then comprises determining whether the transistor sizing ratio between whichever ones of the transistors 304.1, 304.2, ..., 304.m that are still on and the transistor 300 is approximately 1:1 (608). If not, control of the method 600 returns to 604. Otherwise, the method 600 comprises determining whether the voltage at node 202 is equal to (or less than) the terminal reference voltage, which is the voltage at which charging should terminate (610). If not, 610 is repeated. Otherwise, charging is terminated (612).

In the foregoing discussion and in the claims, the terms "including" and "comprising" are used in an open-ended fashion, and thus should be interpreted to mean "including, but not limited to . . . ." An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A device, comprising:
a digital-to-analog converter (DAC) comprising:
first and second transistors coupled to a first amplifier, the second transistor coupled to a first output of the DAC and to an output of the first amplifier;
third and fourth transistors coupled to the first amplifier and to a second output of the DAC, the third and fourth transistors switchably coupled to a voltage supply and to the first transistor;
a first node coupled to the first output of the DAC and to a resistor;
a second node coupled to the second output of the DAC;
a second amplifier coupled to the second node and to the first transistor and switchably coupled to the third and fourth transistors; and
a comparator coupled to the first node.

2. The device of claim 1, further comprising a controller including a register configured to store multiple bits, the controller configured to operate a first switch between the third transistor and the first transistor based on one of the multiple bits and to operate a second switch between the third transistor and the voltage supply based on the one of the multiple bits.

3. The device of claim 2, further comprising another comparator coupled to the first node and to the controller, the controller configured to shift the multiple bits in the register in response to the another comparator indicating that a voltage at the first node is less than a reference voltage.

4. The device of claim 2, wherein the first switch is an n-type metal oxide semiconductor field effect transistor (MOSFET) and the second switch is a p-type MOSFET.

5. The device of claim 1, wherein the DAC is configured to:
provide a first current on the first output of the DAC based on an output of the second amplifier;
provide a second current on the second output of the DAC based on the output of the second amplifier; and
decrease a ratio of the second current to the first current in response to an output of another comparator indicating that a voltage at the first node is below a reference voltage provided to the another comparator.

6. The device of claim 1, further comprising a third amplifier coupled to the first node and to the first transistor and switchably coupled to the third and fourth transistors.

7. The device of claim 6, further comprising:
an analog OR circuit coupled to the DAC.

* * * * *